United States Patent [19]
Yabuta et al.

[11] Patent Number: 5,962,896
[45] Date of Patent: *Oct. 5, 1999

[54] THIN FILM TRANSISTOR INCLUDING OXIDIZED FILM BY OXIDATION OF THE SURFACE OF A CHANNEL AREA SEMICONDUCTOR

[75] Inventors: Satoshi Yabuta, Taki-gun; Katsuhiro Kawai, Yamatotakada; Masaru Kajitani, Osaka, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/570,013
[22] Filed: Dec. 14, 1995

[30] Foreign Application Priority Data

Dec. 20, 1994 [JP] Japan ................................ 6-317086

[51] Int. Cl.⁶ ............................. H01L 29/76; H01L 27/01
[52] U.S. Cl. .............................. 257/347; 257/57; 257/60; 257/66; 257/72
[58] Field of Search ............................. 257/57, 59, 60, 257/61, 66, 72, 347; 437/41

[56] References Cited

U.S. PATENT DOCUMENTS

| | | | |
|---|---|---|---|
| 5,054,887 | 10/1991 | Kato et al. | 257/59 |
| 5,308,998 | 5/1994 | Yamazaki et al. | 257/57 |
| 5,334,859 | 8/1994 | Matsuda | 257/57 |
| 5,427,962 | 6/1995 | Sasaki et al. | 437/41 |

FOREIGN PATENT DOCUMENTS

| | | |
|---|---|---|
| 59-220703 | 12/1984 | Japan . |
| 01120070 | 5/1989 | Japan . |
| 02163971 | 6/1990 | Japan . |
| 02163972 | 6/1990 | Japan . |
| 02268468 | 11/1990 | Japan . |

*Primary Examiner*—Valencia Martin-Wallace
*Attorney, Agent, or Firm*—Nixon & Vanderhye, PC

[57] ABSTRACT

A thin film transistor (TFT) has a substrate. There is provided on the substrate a gate electrode, a gate insulating layer, a semiconductor layer, ohmic contact layers, electrodes (i.e., a source electrode and a drain electrode), and a protective layer in this order. An oxidized film is provided on a channel area of the semiconductor layer. With the arrangement, it is possible, without providing a channel protective layer, to prevent undesirable etching to the channel area, thereby greatly reducing the number of defective products. Since it is not necessary to make the semiconductor layer thicker than is required, it is possible to minimize the occurrence that the TFT characteristic is affected by the projected light. In addition, it is possible to realize miniaturization and to get a great aperture ratio when used as a switching element in a liquid crystal display (LCD) device.

8 Claims, 6 Drawing Sheets

THIN FILM TRANSISTOR INCLUDING OXIDIZED FILM BY OXIDATION OF THE SURFACE OF A CHANNEL AREA SEMICONDUCTOR

FIELD OF THE INVENTION

The present invention relates to a thin film transistor (hereinafter referred to as a TFT) and a manufacturing method thereof, the TFT being used suitably as a switching element in an active matrix type liquid crystal display device :for displaying with high definition and precision, the liquid crystal display device being arranged so that pixels and the switching elements are provided in a matrix manner, the switching elements corresponding to the respective pixels and a driving voltage being selectively applied to the switching elements.

BACKGROUND OF THE INVENTION

FIG. 4 is a sectional view showing the structure of a typical conventional TFT 1 for use in the active matrix type liquid crystal display device. The TFT 1 is provided with a substrate 2, which is made of resin or glass and is an electrical insulating material. There are laminated on the substrate 2 a gate electrode 3 which has a stripe shape and is made of a metallic thin film such as chrome, a gate insulating layer 4 made of SiNx, a semiconductor layer 5 made of amorphous silicon, a channel protective layer 11, ohmic contact layers 6 and 7 in which an impurity such as phosphorus are doped, a source electrode 8 and a drain electrode 9 which are respectively made of a metal such as chrome, and a protective layer 10 in this order. The TFT 1 wherein the gate electrode 3 is first provided on the substrate 2 in the foregoing manner is called as a reverse staggered type TFT.

According to the TFT 1, in the case where the ohmic contact layers 6 and 7 are provided on the semiconductor layer 5, the channel protective layer 11 is provided on the semiconductor layer 5 so that the semiconductor layer 5 is not etched when etching a channel part 12. By the channel part 12 the ohmic contact layer 6 is separated from the ohmic contact layer 7 in accordance with the source electrode 8 and the drain electrode 9 respectively, the respective ohmic contact layers 6 and 7 being uniformly laminated on the semiconductor layer 5.

According to the TFT 1 having the channel protective layer 11, its element becomes greater in size. When the TFT 1 is used in the liquid crystal display device, there arises the problem that an aperture ratio of each element becomes small since each pixel becomes greater in size. To solve the problem, it is well known that a TFT 21 without the channel protective layer 11 can be used (see FIG. 5). The same reference numerals are assigned to the members and means of FIG. 5 which are analogous to or correspond to those of FIG. 4.

A process for manufacturing a plurality of the TFTs 21 on the substrate 2 is explained below referring to FIGS. 6 and 7. First, a metal such as Al, Mo, or Ta etc. is laminated by the sputtering method on the substrate 2, and a gate electrode 3 is formed by patterning the sputtered metal (see step s1). Next, the gate insulating layer 4 is laminated on the gate electrode 3 by the plasma CVD method (see step s2). Then, the semiconductor layer 5, and the ohmic contact layers 6 and 7 are formed.(see step s3).

The semiconductor layer 5 is an i-type semiconductor and the respective ohmic contact layers 6 and 7 are n-type semiconductors. More specifically, the semiconductor layer 5, and the ohmic contact layers 6 and 7 are formed as follows. First the semiconductor layer 5 and the ohmic contact layers 6 and 7 are laminated in this order by the plasma CVD method on the gate insulating layer 4 (see steps s31 and s32). Next, a photoresist 23 is laminated on the ohmic contact layers 6 and 7 (see FIG. 6(a) and step s33). Then the photoresist 23 is patterned so that a channel formation region of each TFT 21 on the substrate 2 is covered (see step s34). Thereafter, the semiconductor layer 5, and the ohmic contact layers 6 and 7 are etched in accordance with the photoresist 23 (see FIG. 6(b) and step s35). Then, the photoresist 23 is removed in step s36, thereby completing the process of a channel formation.

The source electrode 8 and the drain electrode 9 are formed so that the electrodes 8 and 9 are laminated by the sputtering method, and thereafter are patterned (see FIG. 6(c) and steps s4 and s5). Thereafter, the channel part 12 is etched to separate the ohmic contact layer 6 from the ohmic contact layer 7 (see steps s6).

The etching of the channel part 12 is carried out in the following manner. First, a photoresist 24 is laminated as shown in FIG. 6(d) and step s61, then the patterning is carried out in accordance with the channel part 12 (see step s62) and the etching process is further carried out with respect thereto (see FIG. 6(e) and step s63). After the separation of the ohmic contact layers 6 and 7, the photoresist 24 is removed in step s64. Then, the protective layer 10 is formed in step s7, thereby obtaining the TFT 21.

However, the TFT 21 and manufacturing method thereof present the following problems.

When the ohmic contact layers 6 and 7 and the semiconductor layer 5 are made of the same material such as amoruphous silicon, there is no choice to make a difference in the etching speeds between the ohmic contact layers 6 and 7, and the semiconductor layer 5. Accordingly, the depth of etching should be precisely controlled so that the semiconductor layer S is not etched during the etching with respect to the channel part 12 of the ohmic contact layers 6 and 7.

In the case where there is a difference in the etching speeds within the substrate 2, there exists a TPT 21 in which the semiconductor layer 5 is undesirably etched. For example, when the etching speed is faster in the periphery of the substrate 2 than that around the center, there presents the problem that the undesirable etching is carried out with respect to the semiconductor layer 5 of the TFT 21 in the periphery of the substrate 2 when the thorough etching is carried out with respect to the channel part 12 of the ohmic contact layers 6 and 7 of the TFT 21 around the center of the substrate 2. With the arrangement, (1) the number of defective products is greatly increased or (2) the thickness of the semiconductor layer 5 becomes thicker than is required, thereby causing that the TFT characteristic is more likely to be affected by the projected light.

Further, according to the conventional manufacturing process of the TFT 21, there presents, unlike the foregoing conventional manufacturing process of the TFT 1, the problem that the etching process for the channel formation and the etching process for the separation of the ohmic contact layers 6 and 7 can not be carried out in a single step. More specifically, (1) the etching process for the semiconductor layer 5 and the ohmic contact layers 6 and 7 (see FIG. 6(b) and step s35) and (2) the etching process for the channel part 12 (see FIG. 6(e) and step s63) can not be carried out in a same single process. This is based on the fact that the semiconductor layer 5 should also be etched in the etching process (1) while the semiconductor layer 5 should not be etched in the etching process (2).

On the other hand, Laid-open Japanese Patent Application No. 2-268468 discloses another conventional TFT manufacturing method wherein no such channel protective layer 11 is provided. According to the conventional TFT manufacturing method, the semiconductor layer 5 is made of amorphous silicon and the ohmic contact layers 6 and 7 are made of microcrystalline silicon. The microcrystalline silicon is composed of the crystal grains of several hundreds of Å in size and have countless grain boundaries. In contrast, the amorphous silicon has no grain boundary because of its disordered structure. Therefore, in wet etching process, the penetration of the etchant into the grain boundaries (i,e., the etching rate) is faster in the microcrystalline silicon than in the amorphous silicon. Thus, such a difference in the respective etching rates is utilized to improve the etching accuracy of the channel part 12.

Since the dry etching process is carried out based on the gas phase reaction, the etching rate is not greatly affected by the crystalline structure provided that the element of the target to be etched is same. Thus, the conventional TFT manufacturing method presents the problem that the dry etching process can not be adopted. Further, the ohmic contact layers 6 and 7 should be made of the microcrystalline silicon and it takes much longer (e.g., double of the amorphous silicon) to grow the layer of the microcrystalline silicon than to grow the layer of the amorphous silicon. This causes the time for completing the step to be prolonged.

SUMMARY OF THE INVENTION

The present invention is made in the light of the foregoing problems, and the object of the present invention is to provide a thin film transistor and manufacturing method thereof in which an etching depth during etching a channel part is accurately controllable without a channel protective layer irrespective of the kinds of the etching methods and the filming layers' materials.

In order to achieve the foregoing object, the thin film transistor of the present invention is provided with:

a gate electrode provided on a substrate, the substrate having electrical insulating property;

a gate insulating layer provided on the substrate to cover the gate electrode;

a semiconductor layer, provided on the gate insulating layer, which has a channel area above the gate electrode;

contact layers provided on areas on both sides of the semiconductor layer, the channel area being sandwiched between the areas;

a source electrode connected to one of the contact layers; and a drain electrode connected to the other one of the contact layers, wherein there is provided an oxidized film on the channel area of said semiconductor layer.

With the arrangement, the etching rate of the oxidized film is different from that of the contact layers irrespective of the kinds of the etching methods and the filming layers' materials. That is, the etching speed is slower in the oxidized film on the channel area of the semiconductor layer than in the contact layers. Accordingly, it is possible, during etching the channel part of the contact layers in the manufacturing process of the thin film transistor, ① to correctly control the depth of the etching and ② to avoid that the channel area of the semiconductor layer is undesirably etched. Therefore, the following advantages ③ and ④ are obtained in the thin film transistor. More specifically, it is possible to ③ to greatly reduce the number of defective products and it is possible to minimize the occurrence that the TFT characteristic is affected by the projected light, since it is not necessary to make the semiconductor layer thicker than is required, Since no channel protective layer is provided, it is possible ④ to reduce the size of the device and to get a great aperture ratio when the TFT is used as the switching element of the LCD device.

Furthermore, the etching process for performing the channel formation and the etching process for separating one contact layer from another contact layer can be carried out in a same single process, since the oxidized film prevents the channel area of the semiconductor layer from being etched.

It is preferable that the channel area has a shape obtained when the gate electrode is projected onto the semiconductor layer. With the arrangement, it is possible to provide the oxidized film in the following manner. More specifically, a photoresist coated (covered) on the semiconductor layer is exposed from a rear surface side of the substrate so that an area of the photoresist where the exposure light is blocked by the gate electrode is removed, thereby resulting the channel area of the semiconductor layer being uncoated (uncovered). The oxidized film is provided on the surface of the channel area in accordance with the plasma oxidation or by use of an oxidizer. Thus, it is possible, without a separately prepared exclusive mask, to carry out the positioning between the oxidized film and the gate electrode with high accuracy in accordance with a self alignment method.

In order to achieve the foregoing object, a manufacturing method of the thin film transistor of the present invention is carried out in accordance with the following steps; (a) providing a gate electrode on a substrate, the substrate having electrical insulating property; (b) providing a gate insulating layer on the substrate to cover the gate electrode; (c) providing a semiconductor layer on the gate insulating layer; (d) providing an oxidized film On the semiconductor layer by oxidizing a channel area above the gate electrode of the semiconductor layer; and (e) providing a contact layer on the semiconductor layer, and etching the contact layer on the channel area.

According to the manufacturing method of the thin film transistor, in the case where the etching is carried out with respect to the part on the channel area of the contact layer, i.e., the channel part of the contact layer, the depth of the etching can be controlled with accuracy. This is based on the fact that there is a difference in the etching rates of the oxidized film and the contact layer. In other words, the etching speed is slower in the oxidized film on the channel area of the semiconductor layer than in the contact layer. Accordingly, it is avoidable that the channel area of the semiconductor layer is undesirably etched. This results (1) it is possible to greatly reduce the number of defective products and it is also possible to minimize the occurrence that the TFT characteristic is affected by the projected light since it is not necessary to make the semiconductor layer thicker than is required, and (2) it is possible to reduce the size of the device and to get a great aperture ratio when the TFT is used as the switching element of the LCD device, since no channel protective layer is required.

Furthermore, the etching process for performing the channel formation and the etching process for separating one contact layer from another contact layer can be carried out in a same single process, since the oxidized film prevents the channel area of the semiconductor layer from being etched.

It is preferable that, in the foregoing step (d), after applying a negative photoresist onto the semiconductor layer, the exposure it tarried out- from a rear surface side of the substrate so that an area of the photoresist where light is blocked by the gate electrode is removed. Since it is therefore possible to uncover the channel area of the semiconductor layer, the oxidized film is provided on the surface of the channel area in accordance with the plasma oxidation or by use of an oxidizer. Thus, it is possible, without a separately prepared exclusive mask, to carry out the positioning between the oxidized film and the gate electrode with high accuracy in accordance with so-called a self alignment method.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of illustration only, are not in any way intended to limit the scope of the claims of the present invention.

BRIEF DESCRIPTION OF THE DRAWINGS

FIG. 2(a) is a sectional view showing the state where an oxidized film is provided on a channel area of the semiconductor layer, FIG. 2(b) is a sectional view showing the state where a photoresist is laminated on an ohmic contact layer, and FIG. 2(c) is a sectional view showing the state where the channel formation of each TFT is carried out by etching the outer periphery of the ohmic contact layer and the outer periphery of the semiconductor layer, at the same time when the etching process is carried out with respect to channel part of the ohmic contact layer.

FIG. 6(a) is a sectional view showing the state where a photoresist is laminated on an ohmic contact layer, FIG. 6(b) is a sectional view showing the state where a semiconductor layer and the ohmic contact layer are etched for the channel formation, FIG. 6(c) is a sectional view showing the state where a source electrode and a drain electrode are formed by patterning, FIG. 6(d) is a sectional view showing the state where the photoresist is laminated so as to etch the channel part, and FIG. 6(e) is a sectional view showing the state where the channel part is etched.

DESCRIPTION OF THE EMBODIMENTS

Figure 1:
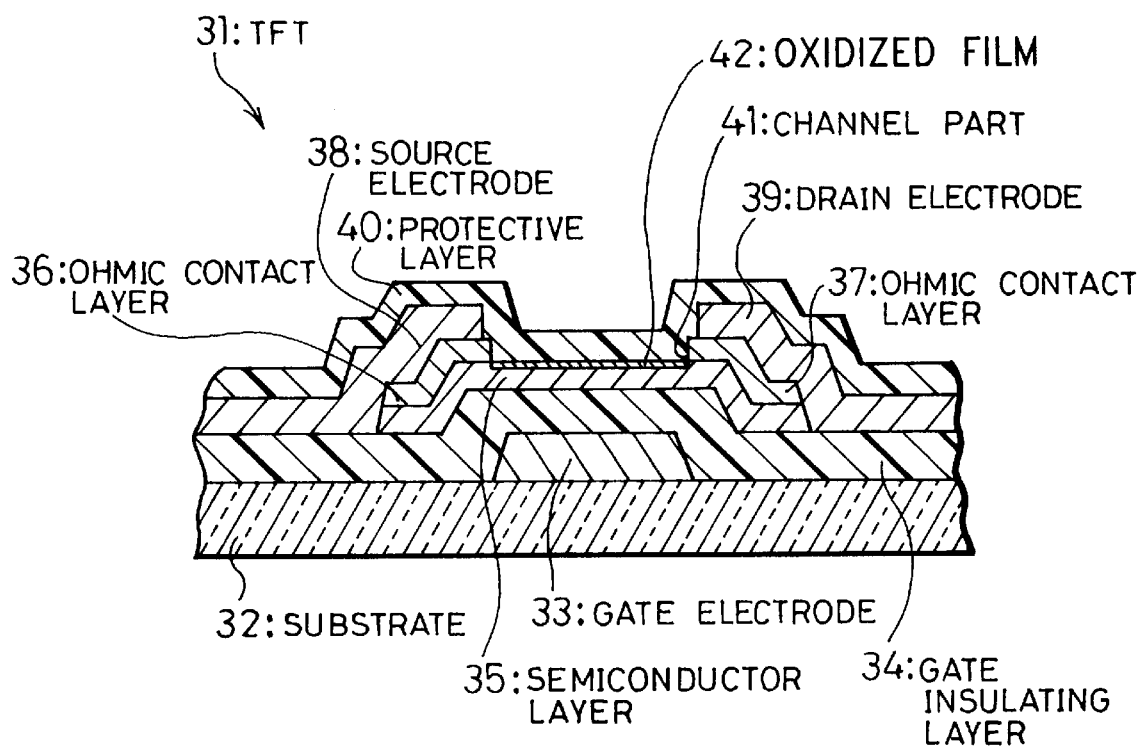
FIG. 1 is a sectional view showing the structure of a thin film transistor (TFT) of an embodiment in accordance with the present invention.
Figure 2A:
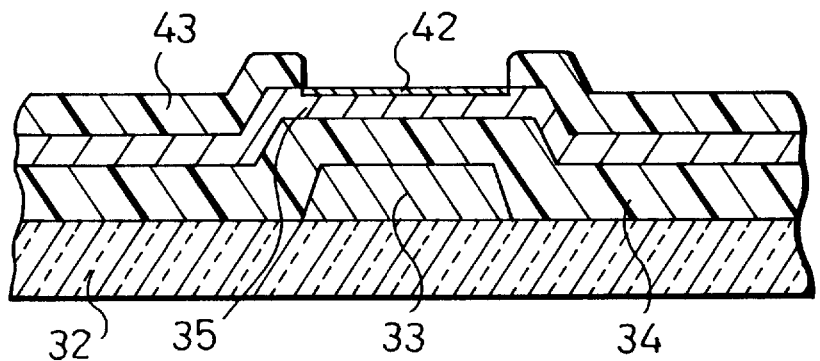
FIGS. 2(a) to 2(c) are sectional views respectively explaining the manufacturing process of the TFT shown in FIG. 1, more specifically.
Figure 2B:
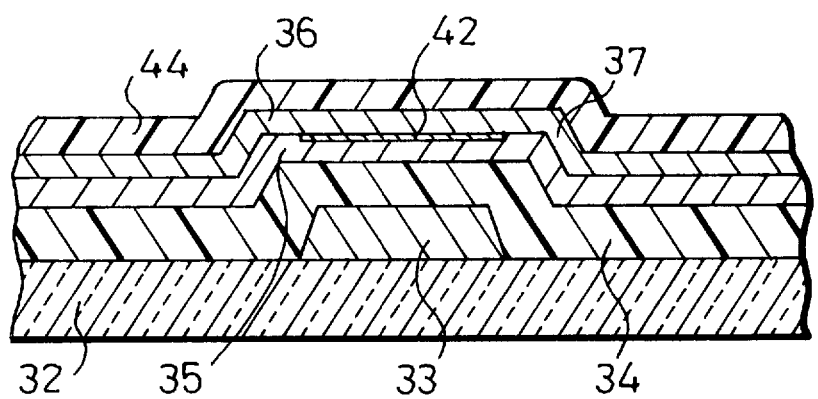
Figure 2C:
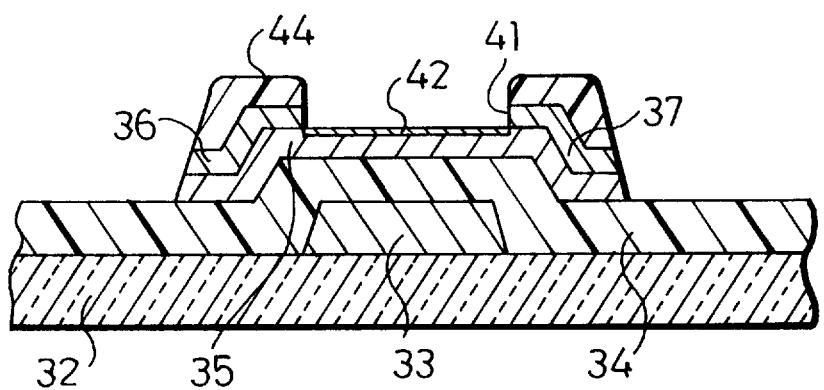
Figure 3:
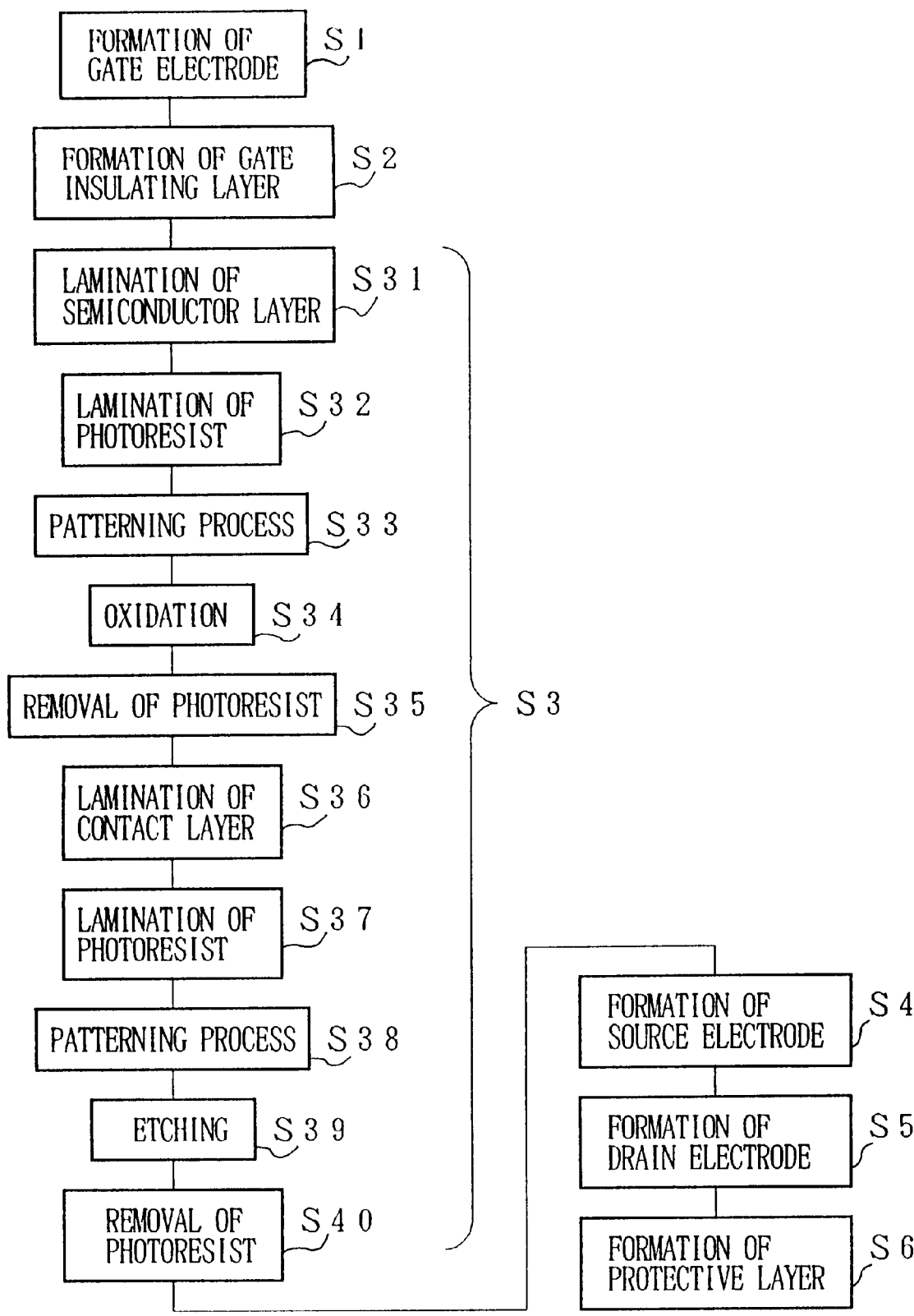
FIG. 3 is a step diagram showing the manufacturing process of the TFT shown in FIG. 1.
Figure 4:
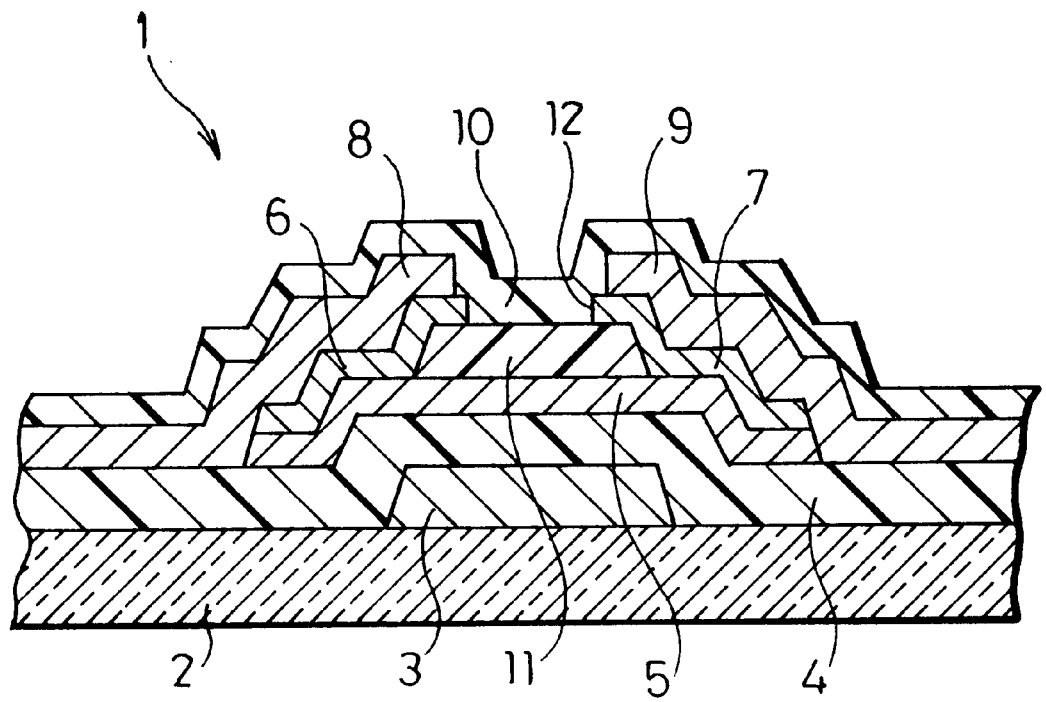
FIG. 4 is a sectional view showing the structure of a typical conventional TFT.
Figure 5:
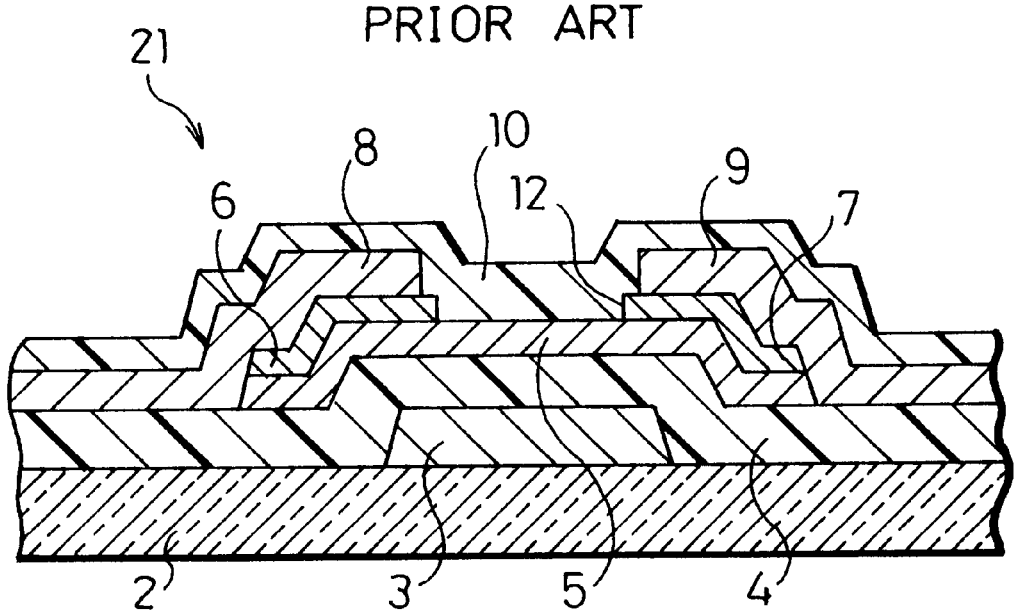
FIG. 5 is a sectional view showing the structure of another typical conventional TFT.
Figure 6A:
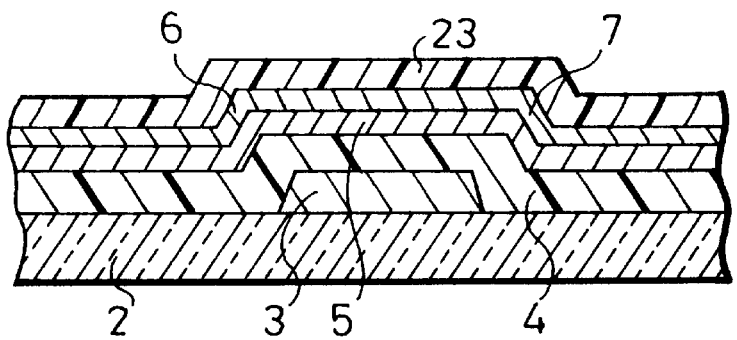
FIGS. 6(a) to 6(e) are sectional views respectively explaining the manufacturing process of the TFT shown in FIG. 5, more specifically.
Figure 6B:
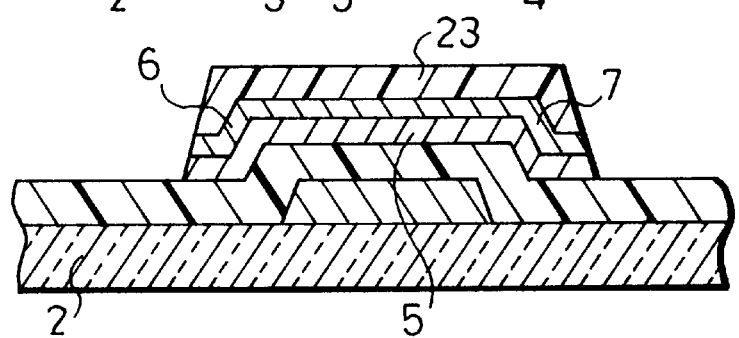
Figure 6C:
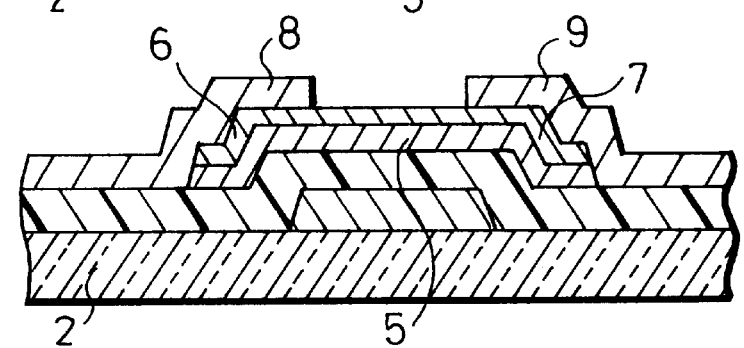
Figure 6D:
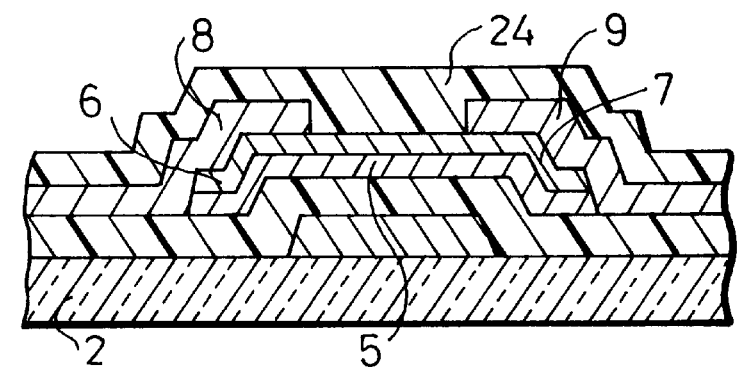
Figure 6E:
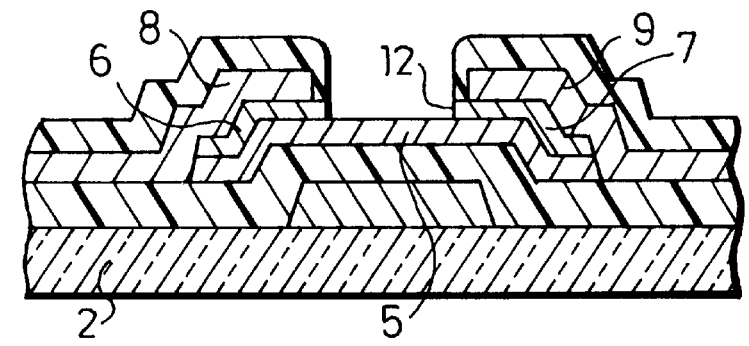
Figure 7:
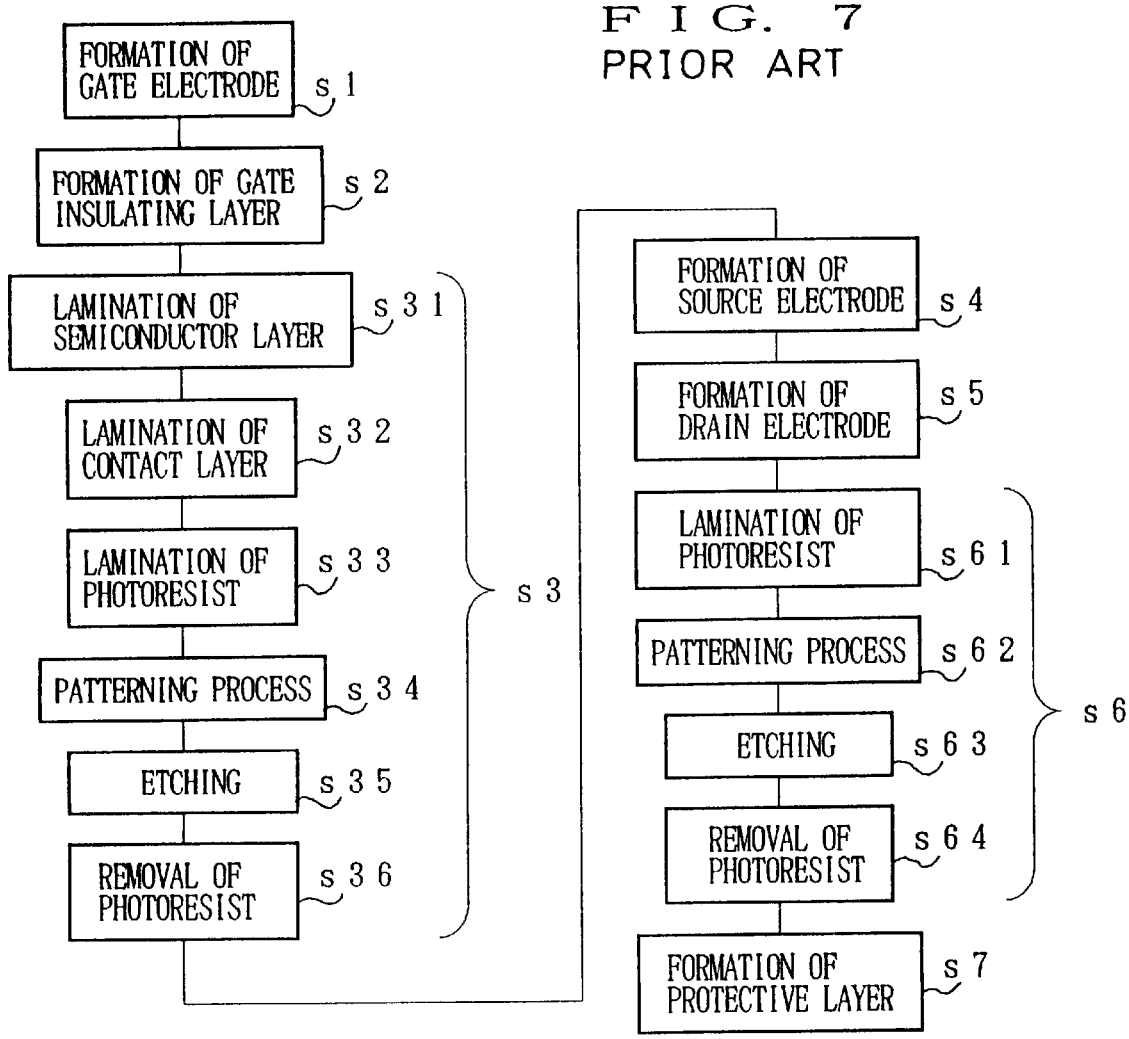
FIG. 7 is a step diagram showing the manufacturing process of the TFT shown in FIG. 5.

The following description discusses an embodiment of the present invention referring to FIGS. 1 through 3.

FIG. 1 is a sectional view showing the structure of a thin film transistor (hereinafter referred to as TFT) 31 of an embodiment of the present invention for use in an active matrix type liquid crystal display (hereinafter referred to as LCD) device. The TFT 31 is provided with a substrate 32. There are laminated on the substrate 32 a gate electrode 33, a gate insulating layer 34, a semiconductor layer 35, ohmic contact layers 36 and 37, a source electrode 38 and a drain electrode 39, and a protective layer 40 in this order. The TFT 31 is a reverse staggered type TFT. The ohmic contact layers 36 and 37 are connected to the source electrode 38 and the drain electrode 39 respectively and are separated by a channel part 41.

An oxidized film 42 is formed on a surface of the semiconductor layer 35, the surface being on the ohmic contact layers 36 and 37 side of the semiconductor layer 35.

The oxidized film 42 is provided on a channel area of the semiconductor layer 35. The area where the oxidized film 42 is provided corresponds to the area where the gate electrode 33 is provided and the channel part 41, seen from the plan view.

The following description discusses the manufacturing process wherein a plurality of TFTs 31 are provided on the substrate 32 referring to FIGS. 2 and 3. There is laminated on the substrate 32 a metal such as Al, Mo, or Ta (see step S1) by the sputtering method, the substrate 32 being (1) a glass plate or (2) a glass plate, having electrical insulating property, coated with an insulating layer such as $Ta_2O_5$ or $SiO_2$. Thereafter, the patterning is carried out so that a gate electrode 33 is provided with a scanning signal line.

Next, the gate insulating layer 34 is provided by laminating a SiNx film having a thickness of 3000 Å on the gate electrode 33 in accordance with the plasma CVD method (see step S2). In order to increase insulating property, first and second insulating layers may be provided, the first insulating layer being obtained by carrying out the anode oxidation with respect to the gate electrode 33 while the second insulating layer being obtained by forming the gate insulating layer 34.

In step S3, (1) the semiconductor layer 35 made of intrinsic amorphous silicon is provided and (2) the ohmic contact layers 36 and 37 made of n+type amorphous silicon or n+type microcrystalline silicon containing phosphorus are formed.

More specifically, the semiconductor layer 35 having a thickness of 400 Å is laminated on the gate insulating layer 34 in accordance with the plasma CVD method (see step S31).

Then, a photoresist 43 is laminated on the semiconductor layer 35 (see FIG. 2(a) and step S32). The photoresist 43 is so-called a negative resist. According to the negative resist, the area where the exposure is carried out remains while the area where the exposure is not carried out is removable. The exposure is carried out from the rear surface side of the substrate 32, i.e., from the opposite side of the gate electrode 33 (see step S33). With the exposure process, only the area of the photoresist 43 where the light is blocked by the gate electrode 33 is removable, and the other area remains without being removed. When the masking is completed by patterning so that the area of the semiconductor layer 35 corresponding to the gate electrode 33, i.e., the channel area is uncovered, the oxidized film 42 is provided on the channel area of the semiconductor layer 35 under $O_2$ plasma circumstance (see step S34). The present embodiment deals with the case where the plasma oxidation is carried out under $O_2$ plasma circumstance. The present invention is not limited to such a case. The wet method using an oxidizer may be substituted for the plasma oxidation.

After the masking by the photoresist 43 is removed in step S35, the ohmic contact layers 36 and 37 having a thickness of 500 Å are laminated an the semiconductor layer 35 in accordance with the plasma CVD method (see FIG. 2(b) and step S36). The photoresist 44 is laminated on the ohmic contact layers 36 and 37 (see step S37). When the patterning of the photoresist 44 is carried out so that an island-pattern masking on the ohmic contact layers 36 and 37 is completed corresponding to the electrodes 38 and 39 (see step S38), the etching process is carried out with respect to the channel part 41 of the ohmic contact layers 36 and 37 in accordance with the dry etching method (see FIG. 2(c) and step S39). At this time, the outer periphery of the ohmic contact layers 36 and 37 and the outer periphery of the semiconductor layer 35 are also etched, thereby performing the channel formation of each TFT 31.

In such a case, it is avoidable that the semiconductor layer 35 is etched, since the oxidized film 42 is provided on the channel area of the semiconductor layer 35 which faces the channel part 41. The present embodiment deals with the case where the dry etching is carried out by use of the mixed gas of HC1 and SF6. However, the present invention is not limited to such a case. The wet etching, by use of Si etching liquid, may be substituted for the dry etching. After the etching of step S39 is completed, the photoresist 44 is removed in step S40.

Ta, Ti or Al is laminated in accordance with the sputtering method and, the patterning is carried out thereby forming the source electrode 38 with a data signal line (see step S4). Further, indium tin oxide (ITO) is laminated in accordance with the sputtering method and, the patterning is carried out thereby forming the drain electrode 39 with a pixel electrode (see step S5). Then, the protective layer 40 is farther provided by laminating SiNx in accordance with the plasma CVD method and by patterning the laminated SiNx, thereby obtaining the TFT 31 (see step S6).

Thus, according to the manufacturing method of the TFT 31 of the present invention, (1) the oxidized film 42 is provided on the channel area of the semiconductor layer 35 facing the channel part 41 and (2) it is avoidable, by making use of the difference in the etching rates of the oxidized film 42 and the ohmic contact layers 36 and 37, that the semiconductor layer 35 is etched during etching the channel part 41 of the ohmic contact layers 36 and 37. Accordingly, without a channel protective layer, it is possible to greatly reduce the possibility, irrespective of the kinds of the etching methods and the filming layers materials, that the semiconductor layer 35 is undesirably etched. This results in that the etching control is carried out with ease and with high accuracy. Therefore, (1) it is possible to greatly reduce the number of defective products and (2) it is possible to minimize the occurrence that the TFT characteristic is affected by the projected light, since it is not necessary to make the semiconductor layer 35 thicker than is required.

Further, in the case where the oxidized film 42 is provided, since the gate electrode 33 is used as a mask during the exposure with respect to the photoresist 43, it is possible, without a separately prepared exclusive mask, to carry out the positioning with high accuracy in accordance with so-called a self alignment method.

Furthermore, (1) it is possible to reduce the size of the TFT 31 since no channel protective layer is provided and (2) it is possible to get a greater aperture ratio when the TFT 31 is used as the switching element of the LCD device.

In addition, (a) the etching process for the channel formation and (b) the etching process for separating the ohmic contact layer 36 from the ohmic contact layer 37 can be carried out in a same single process, More specifically, the outer periphery of the ohmic contact layers 36 and 37 and the outer periphery of the semiconductor layer 35 are etched so that the channel formation of each TFT 31 is performed, while the channel part 12 is etched so that the ohmic contact layer 36 is separated from the ohmic contact layer 37. Since the TFT 31 has the oxidized film 42 formed, it is possible to carry out in a same single process (a) the etching process of the outer periphery of the ohmic contact layers 36 and 37, and of the outer periphery of the semiconductor layer 35, and (b) the etching process of the channel part 41.

The present invention is applicable to the foregoing conventional manufacturing method in which (1) the etching process for the channel formation and (2) the etching process for separating one ohmic contact layer from another are independently carried out in different steps.

There are described above novel features whom one skilled in the art would appreciate give rise to various advantages. Such featured are also considered aspects of the invention covered by the present application, irrespective of whether or not they are included within the scope of the following claims. While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A thin film transistor, comprising:
    a gate electrode provided on a substrate, said substrate having electrical insulating property;
    a gate insulating layer provided on said substrate to cover said gate electrode;
    a semiconductor layer, provided on said gate insulating layer, which has a channel area above said gate electrode;
    contact layers provided on areas on both sides of said semiconductor layer, the channel area being sandwiched between the areas;
    a source electrode connected to one of said contact layers;
    a drain electrode connected to the other one of said contact layers; and
    a film disposed on said channel area, said film being formed of an oxidized intrinsic semiconductor.

2. The thin film transistor as set forth in claim 1, wherein the channel area has a shape of area obtained when said gate electrode is projected onto said semiconductor layer, and a width of said gate electrode is equal to a length of said channel area.

3. The thin film transistor as set forth in claim 1, wherein said semiconductor layer is made of intrinsic amorphous silicon, and said contact layer is made of either an n+ type amorphous silicon containing phosphorus or an n+ type microcrystalline silicon containing phosphorus.

4. The thin film transistor as set forth in claim 1, wherein the oxidized film is formed by either a plasma oxidation under $O_2$ plasma circumstance or a wet method using an oxidizer.

5. The thin film transistor as set forth in claim 1, wherein a protective layer is provided on said source electrode, said drain electrode, and said oxidized films.

6. A thin film transistor used as a switching element of a liquid crystal display device comprising:

a gate electrode provided on a substrate, said substrate having electrical insulating property;

a gate insulating layer provided on said substrate to cover said gate electrode;

a semiconductor layer, provided on said gate insulating layer, which has a channel area above said gate electrode;

contact layers provided on areas on both sides of said semiconductor layer, the channel area being sandwiched between the areas;

a source electrode connected to one of said contact layers;

a drain electrode connected to the other one of said contact layers; and a film disposed on said channel area, said film being formed of an oxidized intrinsic semiconductor.

7. A thin-film transistor according to claim 1, wherein said channel area comprises an intrinsic semiconductor layer, and said oxidized film provided on the channel area is formed by oxidizing a portion of said intrinsic semiconductor layer.

8. A thin-film transistor according to claim 6, wherein said channel area comprises an intrinsic semiconductor layer, and said oxidized film provided on the channel area is formed by oxidizing a portion of said intrinsic semiconductor layer.

* * * * *